(12) United States Patent
Brown et al.

(10) Patent No.: US 10,468,292 B2
(45) Date of Patent: Nov. 5, 2019

(54) SHUTTER DISK FOR PHYSICAL VAPOR DEPOSITION CHAMBER

(71) Applicant: Applied Materials, Inc., Santa Clara, CA (US)

(72) Inventors: Karl M. Brown, Santa Clara, CA (US); Jason Schaller, Austin, TX (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 233 days.

(21) Appl. No.: 15/245,004

(22) Filed: Aug. 23, 2016

(65) Prior Publication Data

US 2016/0358809 A1 Dec. 8, 2016

Related U.S. Application Data

(63) Continuation of application No. 12/563,531, filed on Sep. 21, 2009.

(60) Provisional application No. 61/099,090, filed on Sep. 22, 2008.

(51) Int. Cl.
| | |
|---|---|
| *C23C 16/00* | (2006.01) |
| *H01L 21/687* | (2006.01) |
| *H01J 37/32* | (2006.01) |
| *H01L 21/67* | (2006.01) |
| *C23C 14/50* | (2006.01) |

(52) U.S. Cl.
CPC ........ *H01L 21/68785* (2013.01); *C23C 14/50* (2013.01); *H01J 37/32477* (2013.01); *H01L 21/6719* (2013.01); *H01L 21/67069* (2013.01); *H01L 21/68707* (2013.01)

(58) Field of Classification Search
CPC ............... H01J 37/32477; H01L 21/68785
USPC ................................ 156/345.3, 345.19
See application file for complete search history.

(56) References Cited

U.S. PATENT DOCUMENTS

| | | | |
|---|---|---|---|
| 2,694,589 A | 11/1954 | Dayley | |
| 3,381,660 A | 5/1968 | Bassan | |
| 3,592,353 A | 7/1971 | Bowen | |
| 5,140,482 A | 8/1992 | Kimura et al. | |
| 5,223,112 A | 6/1993 | Tepman | |
| 6,136,106 A * | 10/2000 | Commandeur | B22F 3/115 |
| | | | 148/519 |
| 6,153,022 A * | 11/2000 | Yoshida | C23C 22/23 |
| | | | 148/253 |
| 6,162,297 A | 12/2000 | Mintz et al. | |

(Continued)

FOREIGN PATENT DOCUMENTS

| | | |
|---|---|---|
| CN | 101179005 | 5/2008 |
| JP | 1005302875 | 10/2005 |

(Continued)

OTHER PUBLICATIONS

Chinese Search Report for Application No. 2009801380005 filed Sep. 21, 2009, 2 pages.

(Continued)

*Primary Examiner* — Keath T Chen
(74) *Attorney, Agent, or Firm* — Patterson + Sheridan LLP

(57) ABSTRACT

A shutter disk suitable for shield a substrate support in a physical vapor deposition chamber is provided. In one embodiment, the shutter disk includes a disk-shaped body having an outer diameter disposed between a top surface and a bottom surface. The disk-shape body includes a double step connecting the bottom surface to the outer diameter.

15 Claims, 3 Drawing Sheets

(56) References Cited

U.S. PATENT DOCUMENTS

| | | |
|---|---|---|
| 6,190,513 B1 | 2/2001 | Forster et al. |
| 6,221,504 B1 * | 4/2001 | Pfeffinger ............. B22F 1/0096 428/558 |
| 6,669,825 B2 | 12/2003 | Ohmi et al. |
| 6,736,946 B2 | 5/2004 | Hixson et al. |
| 6,827,825 B2 | 12/2004 | Feltsman et al. |
| 6,847,057 B1 | 1/2005 | Gardner et al. |
| 7,008,517 B2 | 3/2006 | Feltsman |
| 2002/0046944 A1 | 4/2002 | Geva |
| 2002/0090464 A1 | 7/2002 | Jiang et al. |
| 2003/0094366 A1 | 5/2003 | Inaba et al. |
| 2004/0182698 A1 | 9/2004 | Feltsman |
| 2005/0048876 A1 | 3/2005 | West et al. |
| 2005/0051517 A1 | 3/2005 | Oehrlein et al. |
| 2005/0064247 A1 | 3/2005 | Sane et al. |
| 2005/0271984 A1 | 12/2005 | Brueckner et al. |
| 2006/0169900 A1 | 8/2006 | Noji et al. |
| 2007/0095651 A1 | 5/2007 | Ye et al. |
| 2007/0258075 A1 | 11/2007 | Kim et al. |
| 2008/0135859 A1 | 6/2008 | Cho et al. |

FOREIGN PATENT DOCUMENTS

| | | |
|---|---|---|
| KR | 10-0240196 B1 | 1/2000 |
| KR | 10-2007-0107515 | 11/2007 |

OTHER PUBLICATIONS

Final Office Action for U.S. Appl. No. 12/542,501 dated Sep. 7, 2012.
Chinese Search Report for Application No. 2009801380005 filed Sep. 21, 2009.
Prosecution history of U.S. Appl. No. 12/542,501 dated May 24, 2012.
PCT international search report and written opinion of PCT/US2009/057663 dated Apr. 30, 2010.
Office Action for U.S. Appl. No. 12/563,531 dated Sep. 17, 2015.
Final Office Action for U.S. Appl. No. 12/563,531 dated Feb. 15, 2013.
Office Action for U.S. Appl. No. 12/563,531 dated Aug. 2, 2011.
Final Office Action for U.S. Appl. No. 12/563,531 dated Nov. 22, 2013.

* cited by examiner

SHUTTER DISK FOR PHYSICAL VAPOR DEPOSITION CHAMBER

CROSS-REFERENCE TO RELATED APPLICATIONS

This application is a continuation of U.S. patent application Ser. No. 12/563,531, filed Sep. 21, 2009, which claims the benefit of U.S. Provisional Patent Application No. 61/099,090, filed Sep. 22, 2008, both of which are hereby incorporated by reference in their entirety.

BACKGROUND

Field

Embodiments of the present invention generally relate to the field of semiconductor process chambers, and more particularly, to shutter disks for use in semiconductor process chambers.

Description of the Related Art

Conventional semiconductor device formation is commonly performed in one or more process chambers, typically combined to form a multi-chamber processing system (e.g., a cluster tool) which has the capability to process multiple substrates (e.g., semiconductor wafers) in a controlled processing environment. To maintain process uniformity and ensure optimal performance of the process chamber, various conditioning operations are periodically performed. For example, in a physical vapor deposition (PVD) processing chamber, one commonly used conditioning operation is a "burn-in" process, wherein a target disposed in the PVD processing chamber is bombarded with plasma ions to remove oxides or other contaminants from the target prior to performing substrate processes. Another commonly used conditioning operation is a "pasting" process, wherein a covering is applied over material deposited on process chamber surfaces to prevent the material from flaking off the process chamber surfaces and contaminating the substrate during subsequent processes.

In both of the aforementioned conditioning operations, a shutter disk may be positioned via a transfer robot atop a substrate support disposed in the process chamber to prevent the deposition of any materials upon the substrate support. Thus, the shape of the shutter disk is important for both the positional accuracy of robotic handling and placement, along with substrate support coverage, as errors in either may lead to undesirable exposure of the upper surface of the substrate support during the conditioning operations.

Moreover, conventional shutter disks are typically made of a material having a mechanical stiffness sufficient enough to resist deformation due to the additional weight of the deposited material. For example, the shutter disk commonly comprises a metal alloy, such as stainless steel (SST), or a ceramic, such as silicon carbide (SiC). However, shutter disks constructed of such materials weigh a substantial amount, leading to increased costs due to providing and maintaining a transfer robot capable of securely maneuvering the shutter disk. In addition, the coefficient of thermal expansion (CTE) is limited in range, resulting in a potentially significant difference between the coefficients of thermal expansion of the shutter disk and deposited materials, leading to diminished adhesion between the deposited material and the surface of the shutter disk, thus increasing the risk of the deposited material peeling or flaking off and contaminating the underlying substrate support. To alleviate this problem, the surface of the shutter disk may be textured via an abrasive blasting process to increase adhesion. However, due to the hardness of materials such as SST or SiC, such processes are difficult and costly.

Thus, there is a need for an improved shutter disk.

SUMMARY

A shutter disk suitable for shield a substrate support in a physical vapor deposition chamber is provided. In one embodiment, the shutter disk includes a disk-shaped body having an outer diameter disposed between a top surface and a bottom surface. The disk-shape body includes a double step connecting the bottom surface to the outer diameter.

In another embodiment, the shutter disk includes a disk-shaped body. The body has an outer diameter disposed between a top surface and a bottom surface. An outer step and an inner step are formed on the bottom surface, the outer step extending further into the body than the inner step. An outer wall substantially parallel to a centerline of the body connects the outer step to the inner step. An annular groove is formed in the bottom surface disposed radially inward of the inner step.

In another embodiment, a shutter disk having a tuned coefficient of thermal expansion is provided. In some embodiments, a shutter disk having a tuned coefficient of thermal expansion may include a body formed from a first material comprising at least two components, wherein a ratio of each of the at least two components to one another is selected to provide a coefficient of thermal expansion of the body that is substantially similar to a coefficient of thermal expansion of a second material to be deposited atop the body.

In some embodiments, a process chamber may include a chamber body defining an inner volume having a target comprising materials to be deposited atop a substrate disposed therein; a substrate support disposed within the chamber body for supporting the substrate; a shutter disk for protecting the substrate support, the shutter disk comprising a body formed from a composite material having at least two components, wherein a ratio of each of the at least two components to one another is selected to provide a coefficient of thermal expansion of the body that is substantially similar to a coefficient of thermal expansion of materials to be deposited on the shutter disk; and a transfer robot movably coupled to the chamber body for transferring the shutter disk to the substrate support.

In some embodiments, a shutter disk having a tuned coefficient of thermal expansion may include a body having a top surface, bottom surface and a peripheral surface coupling the top surface to the bottom surface, wherein the body comprises aluminum and silicon provided in a ratio of aluminum to silicon of about 1:4 to about 7:3 and wherein the body has a coefficient of thermal expansion that is substantially similar to a coefficient of thermal expansion of a material to be deposited atop the body.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only exemplary embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to semiconductor manufacturing processing chambers, and more particularly, to shutter disks. The inventive apparatus includes a shutter disk for use in conditioning operations of process chambers. The inventive apparatus may advantageously provide a light weight, cost effective shutter disk that is resistant to deformation and provides a tuned coefficient of thermal expansion and improved adhesive properties.

Figure 1:
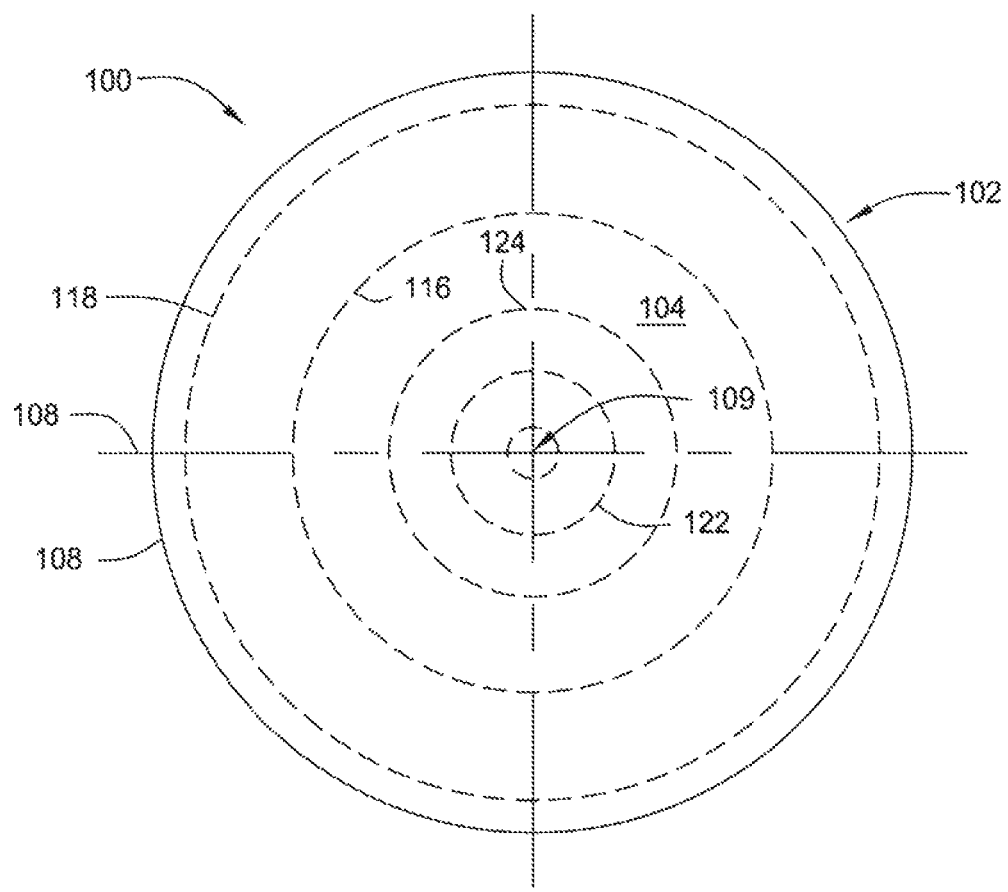
FIG. 1 is a top view of an exemplary shutter disk in accordance with some embodiments of the present invention.
Figure 2:
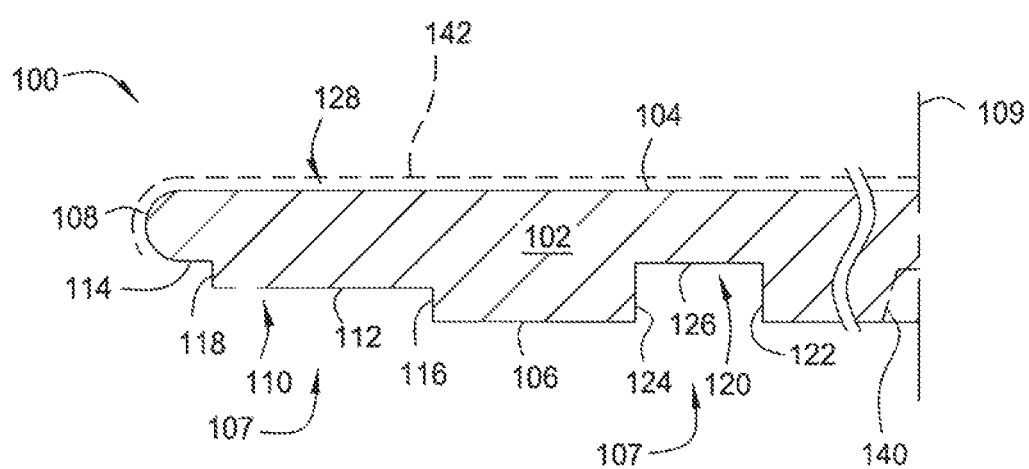
FIG. 2 depicts a partial cross sectional view from the centerline of the exemplary shutter disk of FIG. 1, in accordance with some embodiments of the present invention.

FIG. 1 is a top view of an exemplary shutter disk in accordance with some embodiments of the present invention. FIG. 2 depicts a cross sectional view from the centerline of the exemplary shutter disk of FIG. 1, in accordance with some embodiments of the present invention. To best understand the invention, the reader should refer simultaneously to FIGS. 1 and 2. Although described herein as a disk, the shutter disk may have any suitable geometry as required to operate within a particular processing chamber.

The shutter disk 100 generally comprises a body 102 an outer surface 128. The outer surface 128 includes at least a top surface 104 and bottom surface 106 and an outer diameter 108. Although discussed in terms of an outer diameter and referred to as a disk, the shutter disk 100 is not limited to round shapes and may have any shape suitable for use in a process chamber as disclosed herein. The bottom surface 106 may comprise at least one feature 107 to interface with the components of a transfer robot (not shown) to facilitate stable and precise movement. In one embodiment, the feature 107 formed on the bottom surface 106 of the body 102 is an annular groove 120 and/or a blind hole 140 (shown in phantom). The annular groove 120 and the blind hole 140 are aligned with a centerline 109 of the body 102 to provide a known reference location for interfacing with the robot (not shown).

The top surface 104 is generally planar and has an orientation substantially perpendicular to the centerline 109 of the body 102. The bottom surface 106 is also generally planar and has an orientation substantially perpendicular to the centerline 109 of the body 102. In some embodiments, the body 102 has an outer diameter 108 of about 6 to about 12 inches, for example about 6, 8, or 11.85 inches, and a thickness between the top surface 104 and bottom surface 106 of about 0.1 to about 0.25 inches, for example, about 0.15 inches.

In some embodiments, a double step 110 may be formed in the outer portion of the bottom surface 106, as shown in FIG. 2. The double step 110 comprises an inner step 112 and an outer step 114. The inner step 112 and outer step 114 are substantially parallel to the bottom surface 106. An inner wall 116 separates the inner step 112 from the bottom surface 106. The outer step 114 extends further into the body 102 than the inner step 112 as referenced from the bottom surface 106. The outer step 114 is disposed radially outward of the inner step 112 and it coupled to the outer diameter 108. The outer step 114 is separated from the inner step 112 by an outer wall 118. The outer wall 118 and the inner wall 116 are substantially parallel to the centerline 109 of the body 102. In some embodiments, the transition between the outer step 114 and the top surface 104 may be rounded, for example, the outer diameter 108 may have a full radius.

The groove 120 may be formed in the bottom surface 106 of the body 102 radially inward of the inner step 112. In some embodiments, the groove 120 includes an inner groove wall 122, an outer groove wall 124 and a groove bottom 126. The inner groove wall 122 and outer groove wall 124 are substantially parallel to the centerline 109 of the body 102. The groove bottom 126 is substantially perpendicular to the centerline 109 of the body 102. In some embodiments, the groove bottom 126 extends further into the body 102 than the outer step 114 as referenced from the bottom surface 106.

The body 102 may be constructed of any suitable material having a mechanical stiffness sufficient enough to resist deformation due to the additional weight of materials which may be deposited atop the shutter disk 100. In some embodiments, the material may also be lightweight so as to allow the shutter disk 100 to be easily maneuvered by a transfer robot. In some embodiments, the body 102 may be fabricated from aluminum, aluminum alloys, aluminum silicon alloy or other suitable material. In some embodiments, the body 102 may be fabricated from a metal composite, such as aluminum silicon (AlSi). The body 102 may be fabricated via any method suitable for forming the desired shape, for example, machining, extruding, stamping, mold casting, die casting, spray casting, spray deposition, or the like.

In some embodiments, the body 102 may comprise a first material having a coefficient of thermal expansion (CTE) substantially similar to a second material being deposited atop the shutter disk 100 to facilitate adequate adhesion between surface 128 of the shutter disk 100 and the material being deposited, thereby preventing the deposited material from flaking (e.g., falling off) and reducing particle generation. For example, in embodiments such where titanium (Ti) or titanium nitride (TiN) is to be deposited atop the shutter disk 100 (e.g., having a CTE of between about 9-11 ppm/° C.), the body 102 may comprise AlSi, having a CTE of about 9-11 ppm/° C., or about 11 ppm/° C. In some embodiments, a ratio of components of the material used to form the body 102 may be varied to provide a tunable CTE range. For example, in embodiments such as where the body 102 comprises AlSi, the ratio of aluminum to silicon may be from about 1:4 to about 7:3, resulting in a CTE of about 5 to about 17 ppm/° C. For example, in embodiments where the ratio of aluminum to silicon is about 1:3.5 to 1:4.5, and most preferably 1:4, the CTE may be about 5 ppm/° C. In embodiments where the ratio of aluminum to silicon is about 3:6.5 to 3:7.5 and most preferably 3:7, the CTE may be about 7 ppm/° C. In embodiments where the ratio of aluminum to silicon is about 1:0.75 to 1:1.25 and most preferably 1:1, the CTE may be about 11 ppm/° C. In embodiments where the ratio of aluminum to silicon is about 7:2.5 to 7:3.5 and most preferably 7:3, the CTE may be about 17 ppm/° C.

In some embodiments, the surface 128 of the body 102 may be textured to facilitate improve adhesion with a material deposited thereon, thereby preventing the deposited materials from falling off the shutter disk 100. The surface 128 of the body 102 may be textured by any process suitable to adequately texture or roughen the surface 128 of the body 102, for example, an abrasive blasting process, such as grit blasting, sand blasting, bead blasting, or the like. In some embodiments, such as where the body 102 comprises AlSi, the surface 128 of the body 102 may be textured to a roughness average of up to between about 600 to about 800 $R_a$, by a suitable process, for example, via a grit blasting process.

In some embodiments, at least a portion of the surface 128 of the body 102 may be covered with a coating 142. The coating 142 may be a twin-arc-spray aluminum deposition or other suitable coating. The surfaces receiving the coating 142 may be textured as described above. In one embodiment, the coating 142 is disposed on the top surface 104 and the outer diameter 108 of the body 102.

In some embodiments, a method of forming a shutter disk having a tuned CTE is also provided. For example, in some embodiments, the body 102 may be formed from a first material comprising at least two components, wherein a ratio of each of the at least two components with respect to one another is selected to provide a coefficient of thermal expansion of the body 102 that is substantially similar to a coefficient of thermal expansion of a second material to be deposited atop the body. In some embodiments the components of the first material may be aluminum and silicon. The ratio of aluminum to silicon may be selected to provide a desired coefficient of thermal expansion as discussed above (e.g., the ratio of aluminum to silicon may be from about 1:4 to about 7:3, resulting in a CTE of about 5 to about 17 ppm/° C.). The CTE of the second material may be determined and the ratio of the components of the first material may be selected to provide a CTE that substantially matches the CTE of the second material. For example, in some embodiments, titanium (Ti) or titanium nitride (TiN) is to be deposited atop the shutter disk 100. The CTE of titanium (Ti) or titanium nitride (TiN) is between about 9-11 ppm/° C. As such, the body 102 may comprise aluminum and silicon, having a controlled ratio of aluminum to silicon to provide a CTE of between about 9-11 ppm/° C., or about 11 ppm/° C.

Figure 3:
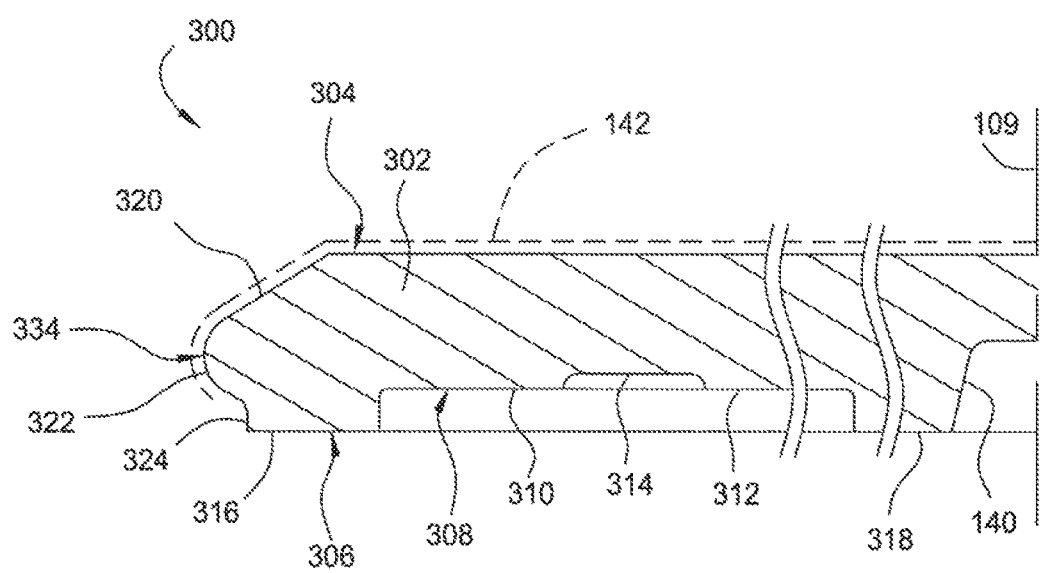
FIG. 3 depicts a partial cross sectional view from the centerline of another embodiment of a shutter disk in accordance with some embodiments of the present invention.

FIG. 3 is a partial cross sectional view from the centerline of another embodiment of a shutter disk 300 in accordance with some embodiments of the present invention. The shutter disk 300 may be fabricated from the materials discussed above with reference to the shutter disk 100.

In one embodiment, the shutter disk 300 includes a body 302 having a top surface 304, an outer diameter 332 and a bottom surface 306. In one embodiment, the outside diameter 332 may be curved, such as having a full radius. In one embodiment, the intersection between the outside diameter 332 and the top surface 304 is a sloped surface 320. The sloped surface 320 may define an angle 334 of between about 30 to 60 degrees, such as about 45 degrees. The top surface 304 is generally perpendicular to a centerline 109 of the body 302. The outside diameter 332 may include an outside diameter wall 324 disposed inward of the outside diameter 332 and the bottom surface 306. In one embodiment, the outside diameter wall 324 is oriented substantially parallel to the centerline 109 of the body 302.

Figure 4:
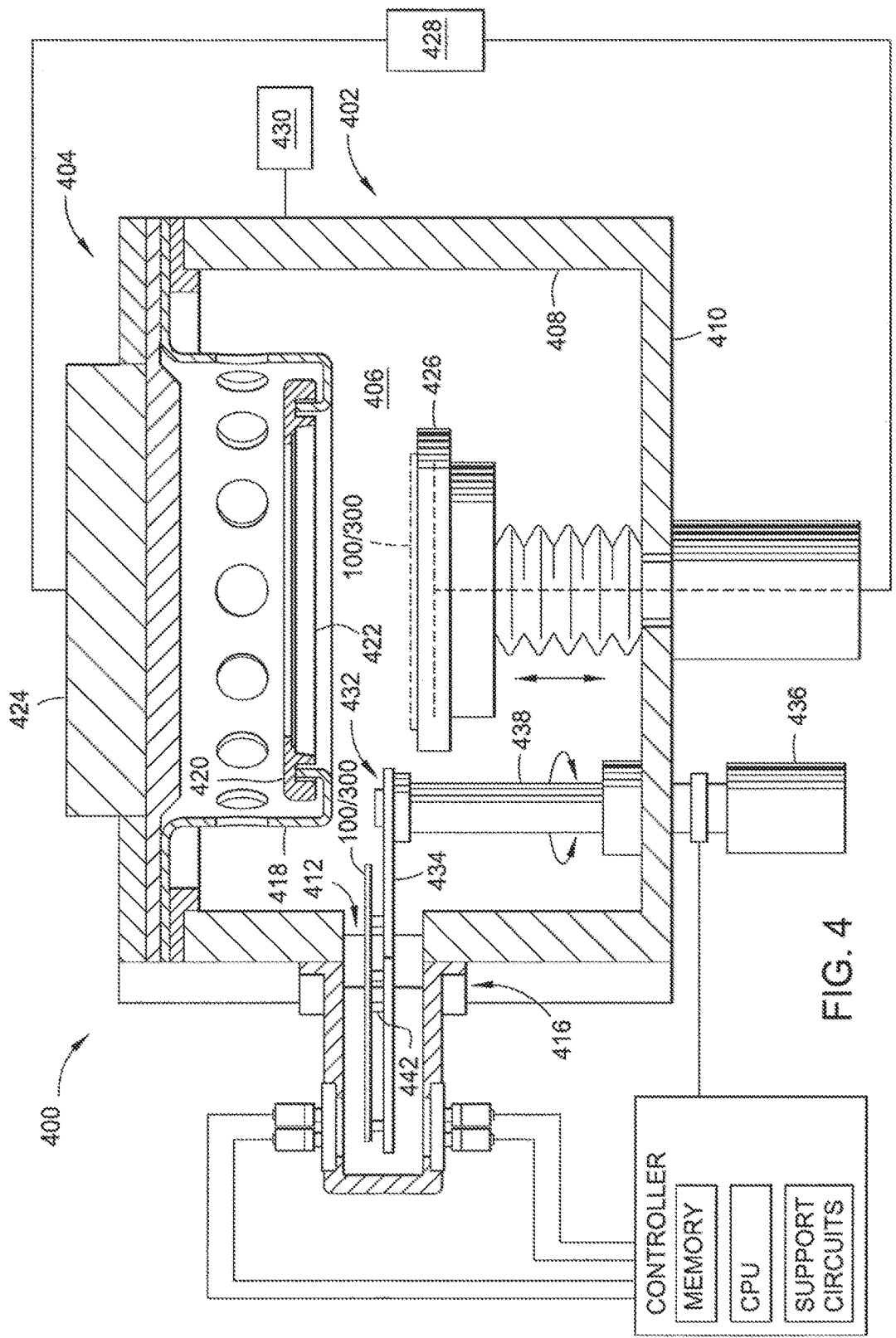
FIG. 4 is a schematic diagram of an exemplary processing chamber suitable for use in connection with some embodiments of the present invention.

The bottom surface 306 includes at least two pads, shown in FIG. 4 as outer support surface 316 and inner support surface 318, which support the body 302 on the upper surface of the substrate support. The outer support surface 316 is disposed adjacent the outside diameter wall 324. The inside support surface 318 is disposed proximate the centerline 109 of the body 302.

The bottom surface 306 of the body 302 may include an optional blind hole 140 for receiving a center locating pin 442 of the robot end effector (as shown in FIG. 4). The blind hole 140 is aligned with the centerline 109 of the body 302.

A double step 308 is formed between the support pads (support surfaces 316, 318) and the bottom surface 306 of the body 302. The double step 308 has two outer steps 310, 312, with the outer step 312 being located outward of and substantially larger than the outer step 310. An inner step 314 is formed between the outer steps 310, 312 and intends further into the body 302 then the outer steps 310, 312.

In one embodiment, at least a portion of the body 102 may be covered with a coating 142. Portions of the body 102 that may receive the coating 142 include the top surface 304, the outer diameter 332 and the sloped surface 320. The coating 142 may be a twin-arc-spray aluminum deposition or other suitable coating as described above. The surfaces receiving the coating 142 may be textured also as described above.

FIG. 4 is a schematic diagram of an exemplary process chamber 400 for use in connection with some embodiments of the present invention. In some embodiments, the process chamber 400 may be one of a plurality of chambers combined to form a multi-chamber processing system (e.g., a cluster tool). In some embodiments, the process chamber 400 may be a deposition chamber, for example, a physical vapor deposition (PVD) chamber. An exemplary process chamber and a cluster tool that may be modified in accordance with the present invention are described in previously incorporated U.S. Provisional Patent Application 61/099,090, filed Sep. 22, 2008, and entitled "SHUTTER DISK AND SYSTEM WITH SHUTTER DISK" and U.S. patent application Ser. No. 12/542,501, filed on Aug. 17, 2009, and entitled "SHUTTER DISK HAVING A TUNED COEFFICIENT OF THERMAL EXPANSION."

The process chamber 400 includes a chamber body 402 and a lid assembly 404 that defines an evacuable process volume 406. The chamber body 402 generally includes sidewalls 408 and a bottom 410. The sidewalls generally contain a plurality of apertures that include an access port, pumping port and a shutter disk port 412 (access and pumping ports not shown). A sealable access port (not shown) provides for entrance and egress of the substrate (not shown) from the process chamber 400. The pumping port is coupled to a pumping system (not shown) that evacuates and controls the pressure within the process volume 406. The shutter disk port 412 is configured to allow at least a portion of a shutter disk 100/300 therethrough when the shutter disk 100/300 is in the cleared position as shown in FIG. 4. A housing 416 generally covers the shutter disk port 412 to maintain the integrity of the vacuum within the process volume 406.

The lid assembly 404 of the chamber body 402 generally supports an annular shield 418 suspended therefrom that supports a shadow ring 420. The shadow ring 420 is generally configured to confine deposition to a portion of the substrate exposed through the center of the shadow ring 420. The lid assembly 404 generally comprises a target 422 and a magnetron 424.

The target 422 provides material that is deposited on the substrate during the deposition process while the magnetron 424 enhances uniform consumption of the target material during processing. The target 422 and substrate support 426 are biased relative each other by a power source 428. An inert gas, for example, argon, is supplied to the process volume 406 from a gas source 430. A plasma is formed between the substrate and the target 422 from the gas. Ions within the plasma are accelerated toward the target 422 and cause material to become dislodged from the target 422. The dislodged target material is attracted towards the substrate and deposits a film of material thereon.

The substrate support 426 is generally disposed on the bottom 410 of the chamber body 402 and supports the substrate during processing. A shutter disk mechanism 432 is generally disposed proximate the substrate support 426. The shutter disk mechanism 432 generally includes a blade 434 that supports the shutter disk 100 and an actuator 436 coupled to the blade 434 by a shaft 438.

The blade 434 may be moved between the cleared position shown in FIG. 4 and a second position that places the shutter disk 100/300 substantially concentric with the substrate support 426 (as shown in phantom in FIG. 4). In the second position, the shutter disk 100/300 may be transferred (by utilizing the lift pins) to the substrate support 426 during the target burn-in and chamber pasting processes. The blade 434 is returned to the cleared position during the target burn-in and chamber pasting processes. The actuator 436 may be any device that may be adapted to rotate the shaft 438 through an angle that moves the blade 434 between the cleared and second positions.

The blade 434 may optionally include a center locating pin 442 sized to mate with the blind hole 140 formed in the center of the bottom of the shutter disk 100/300. The center locating pin 442 locates the shutter disk 100/300 in a predefined position on the blade 434 to facilitate more accurate substrate transfer.

While the foregoing is directed to embodiments of the present invention, other and further embodiments of the invention may be devised without departing from the basic scope thereof, and the scope thereof is determined by the claims that follow.

What is claimed is:

1. A processing apparatus comprising:
   a process chamber; and
   a shutter disk comprising:
   a disk-shaped body configured to cover a substrate support in the process chamber and configured to be transportable within the process chamber on a robot blade, the disk-shaped body comprising:
   a top surface;
   a side surface;
   a bottom surface comprising:
     an annular outer support surface;
     a first annular outer stepped surface disposed radially inward of the annular outer support surface;
     an annular inner stepped surface disposed radially inward of the first annular outer stepped surface;
     a second annular outer stepped surface disposed radially inward of the annular inner stepped surface and coplanar with the first annular outer stepped surface, wherein the annular inner stepped surface extends further into the body than the first annular outer stepped surface and the second annular outer stepped surface; and
     an annular inner support surface disposed radially inward of the second annular outer stepped surface, the annular inner support surface coplanar with the annular outer support surface.

2. The processing apparatus of claim 1, wherein the side surface of the body further comprises:
   an annular side wall connected to the annular outer support surface and oriented substantially parallel to a centerline of the body and having a side wall diameter; and
   an annular protrusion from the annular side wall disposed between the top surface and the bottom surface having an outer diameter larger than the side wall diameter.

3. The processing apparatus of claim 1, wherein the annular inner stepped surface, the first annular outer stepped surface, and the second annular outer stepped surface are substantially perpendicular to the centerline of the body.

4. The processing apparatus of claim 1, wherein the body further comprises:
   a blind hole formed in the bottom surface of the body, a centerline of the blind hole co-linear with a centerline of the body.

5. The processing apparatus of claim 4, wherein the annular inner step surface extends further into the body than the first annular outer stepped surface and the second annular outer stepped surface but less than the blind hole.

6. The processing apparatus of claim 1, wherein the top surface of the body is coated with an aluminum coating.

7. The processing apparatus of claim 1, wherein the top surface of the body is coated with a twin-arc-spray aluminum coating.

8. The processing apparatus of claim 1, wherein the top surface is textured.

9. The processing apparatus of claim 8, wherein the top surface has a roughness average between about 600 $R_a$ and about 800 $R_a$.

10. The processing apparatus of claim 1, wherein the body further comprises:
    a sloped surface coupling the annular protrusion of the side surface to the top surface.

11. The processing apparatus of claim 10, wherein the sloped surface defines an angle between about 30 degrees and about 60 degrees.

12. The processing apparatus of claim 1, wherein the first annular outer stepped surface is larger than the second annular outer stepped surface.

13. The processing apparatus of claim 1, wherein the body is formed of a material having a coefficient of thermal expansion between 5 ppm/° C. and about 17 ppm/° C.

14. The processing apparatus of claim 1, wherein the annular protrusion of the side surface is rounded.

15. The processing apparatus of claim of claim 14, wherein the annular protrusion of the side surface has a full radius.

* * * * *